(12) United States Patent
Sakai

(10) Patent No.: US 7,642,828 B2
(45) Date of Patent: Jan. 5, 2010

(54) LEVEL CONVERSION CIRCUIT WITH DUTY CORRECTION

(75) Inventor: Shingo Sakai, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/447,978

(22) Filed: Jun. 7, 2006

(65) Prior Publication Data

US 2007/0285147 A1 Dec. 13, 2007

(51) Int. Cl.
*H03K 3/017* (2006.01)
(52) U.S. Cl. .................... 327/175; 327/333
(58) Field of Classification Search ............ 327/175, 327/333
See application file for complete search history.

(56) References Cited

U.S. PATENT DOCUMENTS

| | | | | |
|---|---|---|---|---|
| 4,527,075 A | * | 7/1985 | Zbinden | 327/175 |
| 5,896,053 A | * | 4/1999 | Prentice | 327/255 |
| 6,169,434 B1 | * | 1/2001 | Portmann | 327/175 |
| 6,643,790 B1 | * | 11/2003 | Yu et al. | 713/500 |
| 6,833,743 B2 | * | 12/2004 | Gu et al. | 327/175 |
| 6,900,681 B2 | * | 5/2005 | Takano | 327/175 |
| 6,933,759 B1 | * | 8/2005 | Wu et al. | 327/172 |
| 7,203,860 B2 | * | 4/2007 | Ishida et al. | 713/503 |

FOREIGN PATENT DOCUMENTS

| | | |
|---|---|---|
| JP | 2000-305528 | 11/2000 |
| JP | 2001-156597 | 6/2001 |

\* cited by examiner

*Primary Examiner*—Kenneth B. Wells
(74) *Attorney, Agent, or Firm*—McGinn IP Law Group, PLLC

(57) ABSTRACT

A level conversion circuit includes an input section configured to receive a first signal of a first signal level and a correction signal and generates a second signal of a second signal level from the first signal and the correction signal. A level converting section converts the second signal into an output signal of a third signal level, and a duty correcting section generates the correction signal corresponding to a duty ratio of the output signal and outputs the correction signal to the input section.

19 Claims, 8 Drawing Sheets

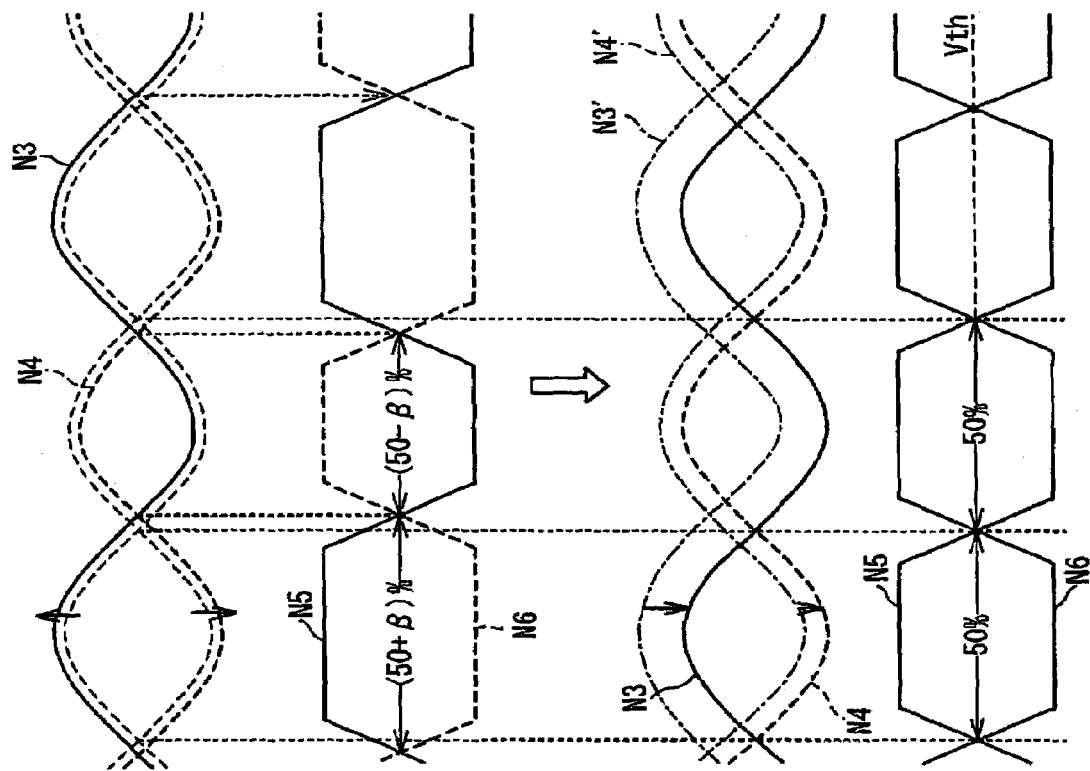

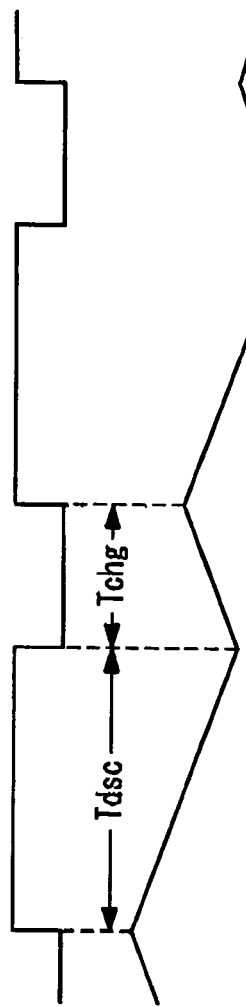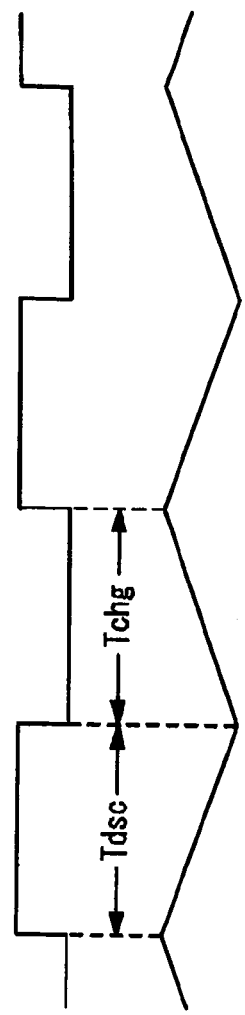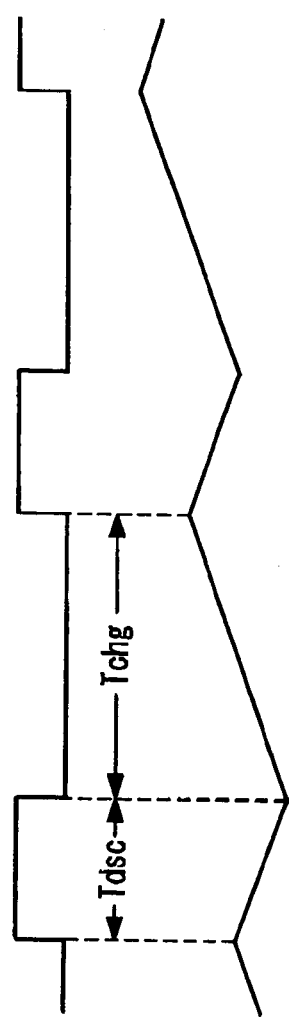
Fig. 8A
Fig. 8B
Fig. 8C
Fig. 8D
Fig. 8E
Fig. 8F

LEVEL CONVERSION CIRCUIT WITH DUTY CORRECTION

BACKGROUND OF THE INVENTION

1. Field of the Invention

The present invention relates to a level conversion circuit, and in particular, relates to duty correction in level conversion of a clock signal.

2. Description of the Prior Art

Semiconductor integrated circuits are required to respond to a high speed operation and a multi-function. With the advancement of the semiconductor technology, a large number of circuit blocks are formed on a single chip, and optimum circuits are constituted for functions to be provided. For this reason, multiple signal levels are often present in the semiconductor integrated circuit. With the high speed operation, in particular, differential interfaces or unbalance interfaces are used for signal transmission. Since a signal of a single end type is usually used in a logic circuit section, a signal level conversion circuit is required in interface between circuit blocks.

Logic circuits often include synchronous circuits, and a clock signal is especially important as the reference of signal timing. Therefore, duty degradation needs to be controlled. However, the duty degradation is caused by relative variations of process level and characteristics, and has great effect on performance degradation of the synchronous circuits. Particularly, there is a possibility that the duty degradation is greater in a long clock line and so on. Therefore, it is desired to perform duty correction in a last stage and to use a clock signal with the duty ratio close to 50% in the synchronous circuits.

In high-speed circuits that transmission rate exceeds the order of GHz, a CML (Current Mode Logic) signals as small-amplitude differential signals with high noise tolerance, are often used in a long clock line and so on. A CML level clock signal is level-converted into a CMOS logic level signal in the last stage, and is used in synchronous circuits of a CMOS configuration in many cases. Level conversion circuits becomes complex in circuit configuration, and are easy to cause duty degradation because of the influence of the relative variations of the process level and characteristics compared with circuits for the small-amplitude differential signals.

A level conversion circuit for clock signals is disclosed in Japanese Laid Open Patent Application (JP-P2000-305528A), for example. The conventional level conversion circuit is provided with a level converting section 21 and a cross-point correction section 22, as shown in FIG. 1. The level converting section 21 performs level conversion, converting a clock signal of a first signal level (e.g., the level of a CML signal as a small-amplitude differential signal) into a clock signal of a second signal level (e.g. the CMOS logic level). The clock signal of the second signal level is supplied to the cross-point correcting section 22 for cross-point correction. The cross-point correction section 22 is provided with inverters 25 to 28, and performs the cross-point correction such that the duty ratio of two-phase clock signals of the second signal level is 50 percent.

FIGS. 2A to 2E show examples of signal waveforms at nodes N1 and N2 to which input signals of the first signal level are applied, at output nodes N7 and N8 of the level converting section 21, and at output nodes N9 and N10 of the cross-point correction section 22. As shown in FIG. 2A, differential signals of sine waveforms are supplied to the input nodes N1 and N2. When the characteristics of the level converting section 21 match with positive phase and reverse phase signals, the output of the level converting section 21 (the nodes N7 and N8) is a clock signal with the duty ratio of 50%, as shown in FIG. 2B. As a result, the clock signal with the duty ratio of 50% is also outputted to the nodes N9 and N10 as well.

When the second signal level is a signal level in which variations are liable to occur in rising and falling characteristics of signals, as in case of the CMOS logic level, signals at the nodes N7 and N8 may have the duty ratio of $(50\pm\alpha)$% as shown in FIG. 2C. In this case, the duty ratio is 50% at a voltage where the signals of the nodes N7 and N8 intersect, and the duty correction is then performed by the cross-point correction section 22, and signals with the duty ratio of 50% are supplied to the nodes N9 and N10.

However, when a normal mode offset occurs to input signals as shown in FIG. 2D, signal waveforms at the nodes N7 and N8 do not show the duty ratio of 50% even at cross points in many cases. In these cases, improvement of the duty ratio is not possible even when the cross-point correction is performed by the cross-point correction section 22, where signals at the nodes N9 and N10 show the duty ratios of $(50\pm\beta)$%, as shown in FIG. 2E.

The duty correction is thus possible by utilizing a reverse-phase signal, when the cause of duty degradation affects a common mode in differential signals. However, when a normal mode is affected, namely when the differential signals are imbalanced, the duty correction is not possible even by utilizing the reverse-phase signal.

In conjunction with the above description, Japanese Laid Open Patent Application (JP-P2001-156597A) discloses a technique to adjust a duty ratio of output of a voltage controlled oscillator circuit. A duty correcting circuit inputs a reverse output and a non-reverse output from a voltage controlled oscillator circuit. The duty correcting circuit is provided with an output adjustment section. The output adjustment section outputs output waveform signals in which a low level pulse width for a pulse period of the reverse output and a high level pulse width for a pulse period of the non-reverse output are equal. This output adjustment section is an RS flip-flop to input the reverse output and the non-reverse output of the voltage controlled oscillator circuit.

SUMMARY OF THE INVENTION

In an aspect of the present invention, a level conversion circuit includes an input section configured to receive a first signal of a first signal level and a correction signal and generates a second signal of a second signal level from the first signal and the correction signal. A level converting section converts the second signal into an output signal of a third signal level, and a duty correcting section generates the correction signal corresponding to a duty ratio of the output signal and outputs the correction signal to the input section.

Here, the duty correcting section may include an integrating circuit configured to measure the duty ratio of the output signal.

Also, the duty correcting section may include a constant current source; a current mirror circuit section configured to supply a current corresponding to a current supplied from the constant current source; and a capacitive element connected to the current mirror circuit section and configured to carry out charging and discharging operations by using the corresponding current based on the output signal. The duty ratio may be measured based on a voltage across the capacitive element.

In this case, the duty correcting section may generate the correction signal such that a time of the charging operation of the capacitive element is equal to that of the discharging operation of the capacitive element.

Also, the first signal of the first signal level may be a clock signal of a CML (Current Mode Logic) level as a small amplitude differential signal, and the output signal of the third signal level may be a differential clock signal of a CMOS logical level.

Also, the level converting section may include a cross-point correcting circuit configured to correct a cross-point of the output signal to a threshold of the CMOS logical level.

Also, the cross-point correcting circuit may include a pair of CMOS inverters connected in parallel in opposing directions, the level converting section has two output terminals, and the parallel connection of the CMOS inverters is connected between the two output terminals.

Also, the duty correcting section may include a constant current source; a current mirror circuit section configured to supply a current corresponding to a current supplied from the constant current source; and a capacitive element connected to the current mirror circuit section and configured to carry out charging and discharging operations by using the corresponding current based on the output signal. The duty ratio may be measured based on a voltage across the capacitive element.

Also, the duty correcting section may generate the correction signal such that a time of the charging operation of the capacitive element is equal to that of the discharging operation of the capacitive element.

Also, the input section may include an input section differential transistor pair, and the duty correcting section may include a correcting section differential transistor pair connected in parallel with the input section differential transistor pair. The second input signal may be generated through current addition of a drain current of the input section differential transistor pair and a drain current of the correcting section differential transistor pair.

Also, in another aspect of the present invention, a method of converting a signal level of a signal may be achieved by amplifying a first signal of a first signal level; by calculating an addition of the amplification result and a correction amount to generates a second signal of a second signal level; by converting the second signal into an output signal of a third signal level; and by feeding back the correction amount corresponding to a duty ratio of the output signal.

Here, the feeding back may be achieved by supplying a constant current; by supplying a current corresponding to the constant current; by carrying out charging and discharging operations of a capacitive element by using the corresponding current based on the output signal, and by determining the duty ratio based on a voltage across the capacitive element.

Also, the feeding back may be achieved by determining the correction amount such that a time of the charging operation of the capacitive element is equal to that of the discharging operation of the capacitive element.

Also, the first signal of the first signal level may be a clock signal of a CML (Current Mode Logic) level as a small amplitude differential signal, and the output signal of the third signal level may be a differential clock signal of a CMOS logical level.

Also, the converting may be achieved by correcting a cross-point of the output signal to a threshold of the CMOS logical level.

Also, the correcting may be achieved by a pair of CMOS inverters connected in parallel in opposing directions.

Also, the feeding back may be achieved by supplying a constant current; by supplying a current corresponding to the constant current; by carrying out charging and discharging operations of a capacitive element by using the corresponding current based on the output signal; and by determining the duty ratio based on a voltage across the capacitive element.

Also, the feeding back may be achieved by determining the correction amount such that a time of the charging operation of the capacitive element is equal to that of the discharging operation of the capacitive element.

BRIEF DESCRIPTION OF THE DRAWINGS

FIGS. 7A to 7D are timing charts showing of signal waveforms at each section in the level conversion circuit according to the embodiment of the present invention; and FIGS. 8A to 8F are timing charts showing a duty measuring operation in the duty correcting section according to the embodiment of the present invention.

DESCRIPTION OF THE PREFERRED EMBODIMENTS

Hereinafter, a level conversion circuit of the present invention will be described in detail with reference to the attached drawings. In the following description, the level conversion circuit carries out level conversion of an input clock signal of a CML level as a small amplitude differential signal into a clock signal of a CMOS logic level.

Figure 3:
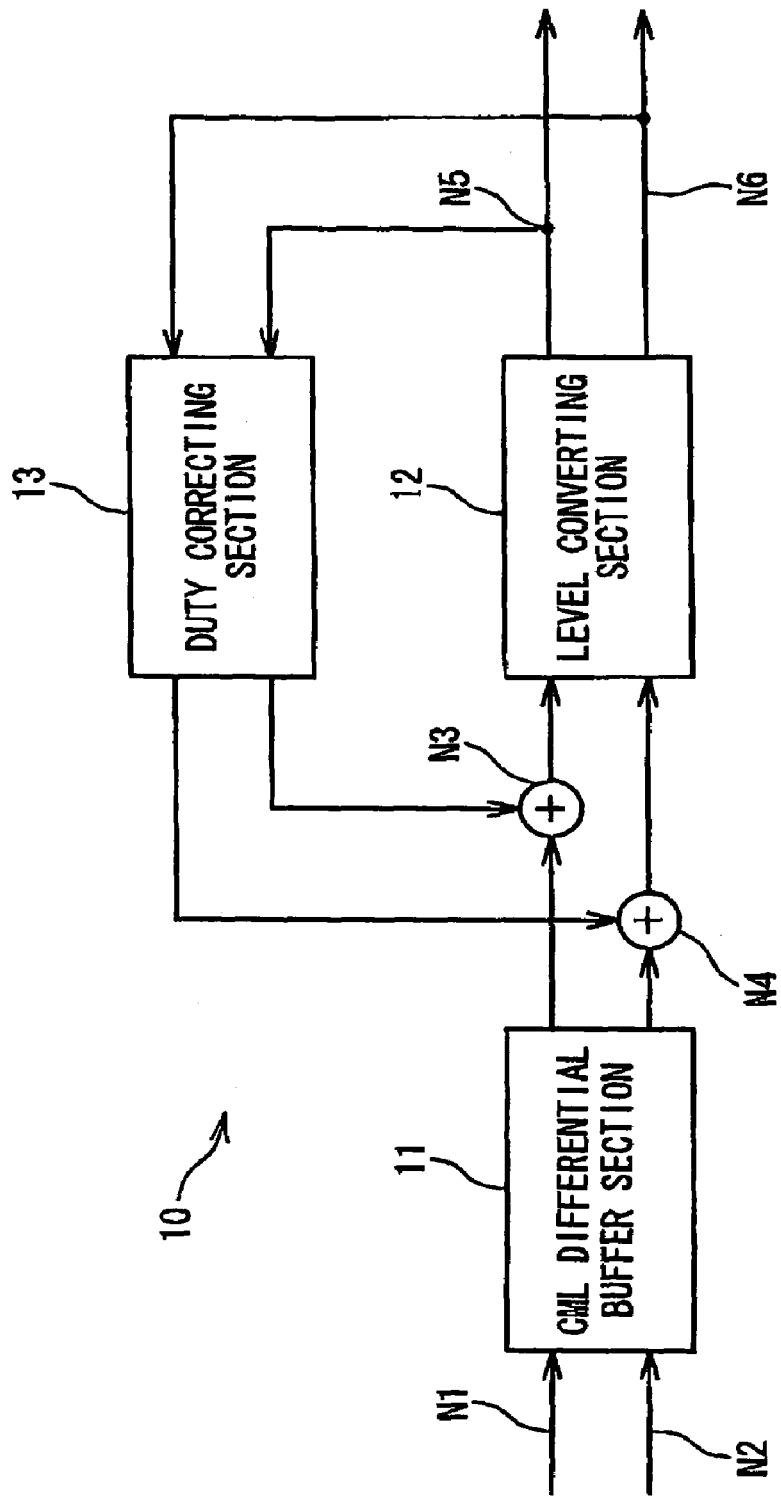
FIG. 3 is a block diagram showing the configuration of a level conversion circuit according to an embodiment of the present invention.

FIG. 3 is a block diagram showing a configuration of a level conversion circuit according to an embodiment of the present invention. The level conversion circuit 10 is provided with a CML differential buffer section 11, a level converting section 12, and a duty correcting section 13. The CML differential buffer section 11 as an input section has input signals of the CML level applied to nodes N1 and N2. Output signals of the CML differential buffer section 11 and those of the duty correcting section 13 are supplied to nodes N3 and N4 and are subjected to current addition therein, and the current addition resultant signals are outputted to the level converting section 12. The level converting section 12 outputs signals converted to have the CMOS logic level to nodes N5 and N6. The signals outputted to the nodes N5 and N6 are then supplied to the duty correcting section 13, and are also supplied to a circuit in the next stage as the output of the level conversion circuit 10. In other words, the duty correcting section 13 is provided in a feedback loop to a differential signal line where the CML differential buffer section 11 and the level converting section 12 are cascade-connected, and the feedback loop is provided from the output of the level converting section 12 to the input thereof.

Figure 4:
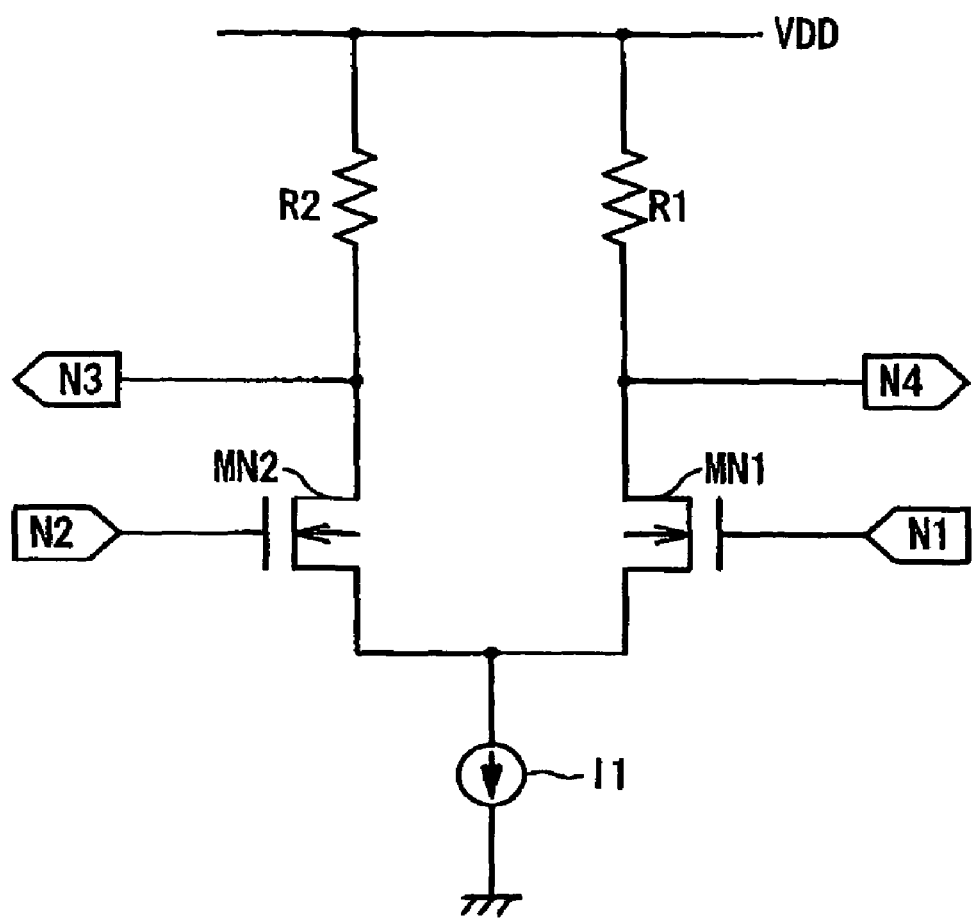
FIG. 4 is a circuit diagram showing the configuration of a differential buffer section according to the embodiment of the present invention.

FIG. 4 is a circuit diagram showing the CML differential buffer section 11. Referring to FIG. 4, the CML differential buffer section 11 is a basic differential buffer which is provided with N-channel MOS transistors MN1 and MN2 for a differential transistor pair, resistors R1 and R2, and a constant current source I1. The constant current source I1 is connected to common sources of the N-channel MOS transistors MN1 and MN2, and the resistors R1 and R2 having the same resistance are connected to drains of these transistors as loads. The other ends of the resistors R1 and R2 are connected to a power supply VDD. Connection nodes N3 and N4 between the resistor R2 and the N-channel MOS transistor MN2 and between the resistor R1 and the N-channel MOS transistor MN1 respectively, serve as output nodes of the CML differential buffer section 11.

Input differential signals of the CML level are applied to the nodes N1 and N2, and amplified signals are outputted from the nodes N3 and N4. Additionally, N-channel MOS transistors MN22 and MN21 to be described later are connected to the nodes N3 and N4 in parallel with the N-channel MOS transistors MN1 and MN2. Therefore, the currents flowing through the resistors R1 and R2 are additions of the currents flowing through the N-channel MOS transistors MN1 and MN2 and the currents flowing through the N-channel MOS transistors MN22 and MN21, respectively. That is, by voltage drops caused by the currents flowing through the N-channel MOS transistors MN22 and MN21, voltages in the nodes N3 and N4 are lower than voltage lower from the power supply voltage (VDD) by voltages generated in response to the input differential signals. Consequently, the voltage in the nodes N3 and N4 are controlled by the duty correcting section 13.

Figure 5:
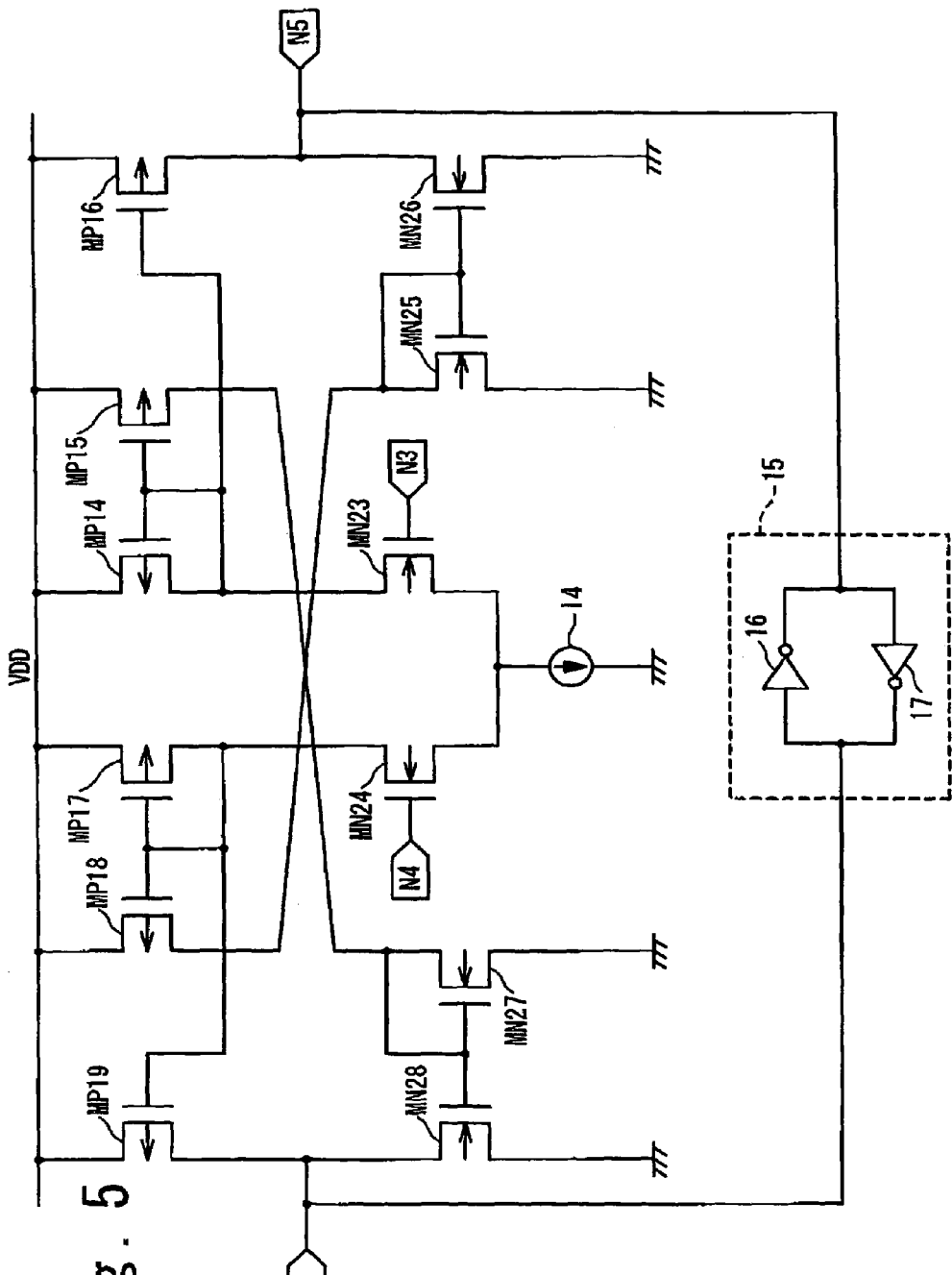
FIG. 5 is a circuit diagram showing the configuration of a level converting section according to the embodiment of the present invention.

FIG. 5 is a circuit diagram showing the level converting section 12. Referring to FIG. 5, the level converting section 12 is provided with N-channel MOS transistors MN23 to MN28, P-channel MOS transistors MP14 to MP19, a constant current source I4, and inverters 16 and 17 for a cross-point correcting section 15. Here, an operation of the level converting section 12 will be described under the assumption that the N-channel MOS transistors MN23 and MN24, the N-channel MOS transistors MN25 to MN28, and the P-channel MOS transistors MP14 to MP 19 have the same size. When the sizes of transistors are compared in the following description, the transistors have the same gate length L and have different gate widths.

The N-channel MOS transistors MN23 and MN24 form a differential transistor pair and their gates are connected to the nodes N3 and N4 respectively. Common sources of the N-channel MOS transistors MN23 and MN24 are connected to a ground through a constant current source I4. The P-channel MOS transistor 14 is connected as a load between a drain of the N-channel MOS transistor MN23 and a power supply VDD. Common sources of the P-channel MOS transistors MP14, MP15, and MP16 are connected to the power supply VDD, and respective gates of the P-channel MOS transistors MP14, MP15, and MP16 are connected to a drain of the P-channel MOS transistors MP14, to form current mirror circuits. Drain currents flowing through the P-channel MOS transistors MP15 and MP16 are equal to a drain current flowing through the P-channel MOS transistor MP14. The N-channel MOS transistor MN27 is connected between the drain of the P-channel MOS transistor MP15 and the ground. Common sources of the N-channel MOS transistors MN27 and MN28 are connected to the ground and respective gates of the N-channel MOS transistors MN27 and MN28 are connected to a drain of the N-channel MOS transistor MN27, to form a current mirror circuit. A drain current flowing through the N-channel MOS transistor MN28 is equal to a drain current through the N-channel MOS transistor MN27.

The P-channel MOS transistor MP17 is connected as a load between a drain of the N-channel MOS transistor MN24 and the power supply VDD. Common sources of the P-channel MOS transistors MP17, MP18, and MP19 are connected to the power supply VDD and respective gates of the P-channel MOS transistors MP17, MP18, and MP19 are connected to a drain of the P-channel MOS transistor MP17, to form current mirror circuits. Drain currents flowing through the P-channel MOS transistors MP18 and MP19 are equal to a drain current flowing through the P-channel MOS transistor MP17. The N-channel MOS transistor MN25 is connected between a drain of the P-channel MOS transistor MP18 and the ground. Common sources of the N-channel MOS transistors MN25 and MN26 are connected to the ground and respective gates of the N-channel MOS transistors MN25 and MN26 are connected to a drain of the N-channel MOS transistor MN25, to form a current mirror circuit. A drain current flowing through the N-channel MOS transistor MN26 is equal to a drain current flowing through the N-channel MOS transistor MN25.

With the above differential transistors pair and current mirror circuits, a CMOS circuit as load capacitance connected to nodes N5 and N6 is charged up to a VDD level or discharged down to a ground level with a current corresponding to a voltage difference between differential signals applied to the nodes N3 and N4. Therefore, input differential signals of the CML level are converted into differential signals of the CMOS logic level.

Figure 1:
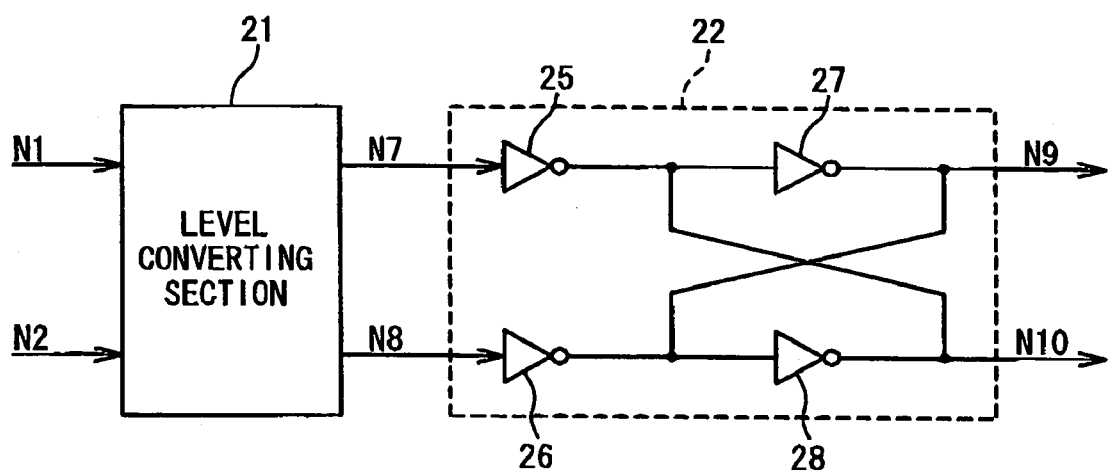
FIG. 1 is a block diagram showing a configuration of a conventional level conversion circuit.
Figure 2:
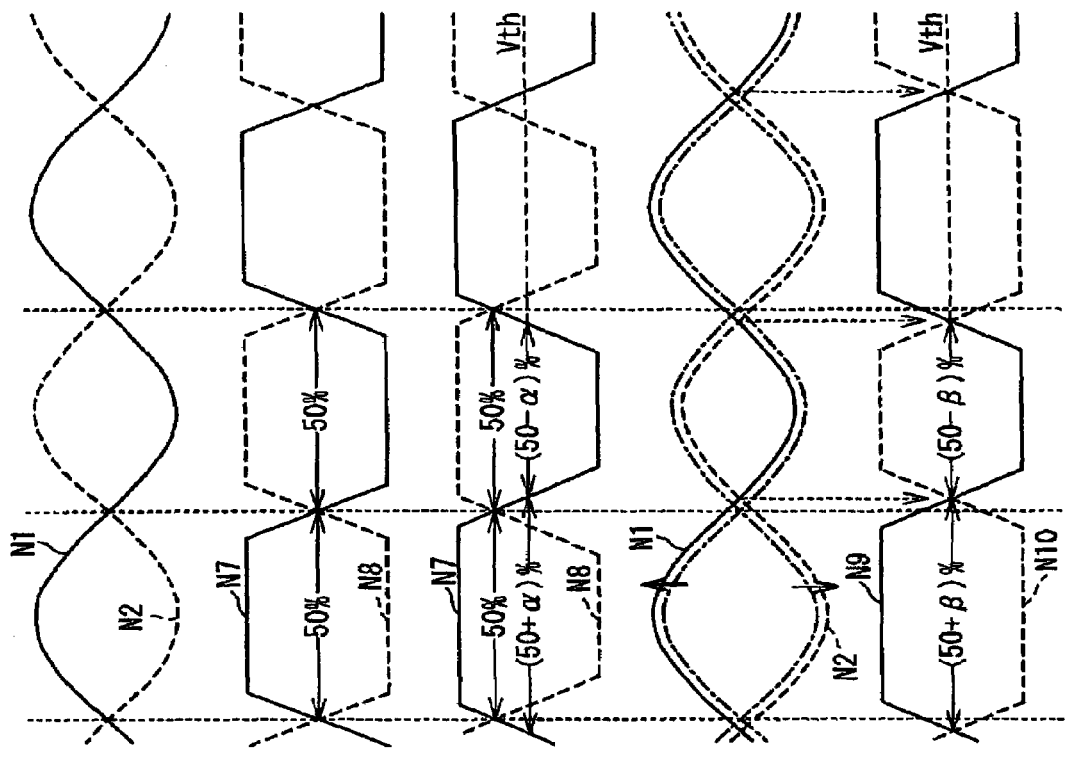
FIGS. 2A to 2E are timing charts showing signal waveforms at each section in the conventional level conversion circuit.

Further, the cross-point correcting circuit 15 is connected between the nodes N5 and N6 and an input of the CMOS inverter 16 and an output of the CMOS inverter 17, and an output of the CMOS inverter 16 and an input of the CMOS inverter 17 are connected. When a cross point of the differential signals of the CMOS logic level outputted to the nodes N5 and N6 deviates from a threshold (Vth) of the CMOS logic level (see FIG. 2C), the cross-point correcting circuit 15 corrects the cross point approximately to the threshold value (Vth) of the CMOS logic level (see FIG. 2B). As a result, improvement in duty correction performance is expected. The configuration of the level converting section 12 is not limited to the above configuration.

Figure 6:
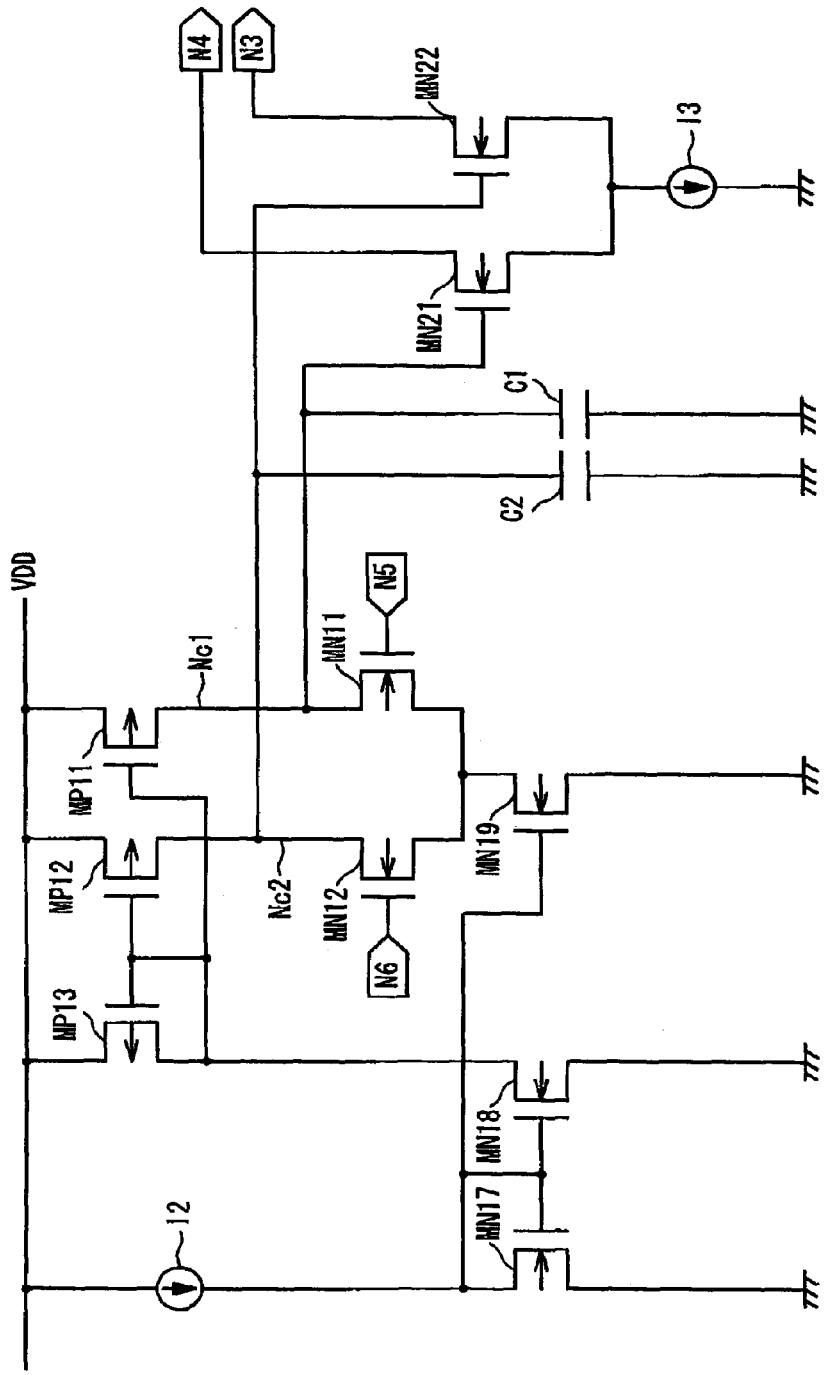
FIG. 6 is a circuit diagram showing the configuration of a duty correcting section according to the embodiment of the present invention.

FIG. 6 is a circuit diagram showing the duty correcting section 13. Referring to FIG. 6, the duty correcting section 13 is provided with N-channel MOS transistors MN11, MN12, MN17 to MN19, MN21, and MN22, P-channel MOS transistors MP11 to MP13, capacitive elements C1 and C2, and constant current sources I2 and I3. The N-channel MOS transistors MN11 and MN12 form a differential transistor pair, and their gates are connected to nodes N5 and N6, respectively. Common sources of the N-channel MOS transistors MN11 and MN12 are connected to a drain of the N-channel MOS transistor MN19. Drains of the N-channel MOS transistors MN11 and MN12 are connected to nodes Nc1 and Nc2, respectively. One end of the capacitive element C1 and a gate of the N-channel MOS transistor MN21 are connected to the node Nc1. In the same way, one end of the capacitive element C2 and a gate of the N-channel MOS transistor MN22 are connected to the node Nc2. The other respective ends of the capacitive elements C1 and C2 are connected to the ground. A source of the N-channel MOS transistor MN19 is connected to the ground.

The N-channel MOS transistors MN17, MN18, and MN19 form current mirror circuits and their gates are connected to a drain of the N-channel MOS transistor MN17. The constant current source I2 is connected between the drain of the N-channel MOS transistor MN17 and the power supply VDD, to supply a drain current of the N-channel MOS transistor MN17. Sources of the N-channel MOS transistors MN17 and MN18 are connected to the ground.

The P-channel MOS transistor MP13 is connected between a drain of the N-channel MOS transistor MN18 and the power supply VDD. Common sources of the P-channel MOS transistors MP13, MP12, and MP11 are connected to the power supply VDD and respective gates of the P-channel MOS transistors MP13, MP12, and MP11 are connected to a drain of the P-channel MOS transistor MP13, to form current mirror circuits. The size of the P-channel MOS transistor MP13 is two times as large as the sizes of the P-channel MOS transistors MP12 and MP11. A drain current flowing through the N-channel MOS transistor MN18 is equal to a value of current supplied by the constant current source I2. Therefore, the P-channel MOS transistors MP12 and MP11 function as constant current sources, each of which supplies a half current of the current supplied by the constant current source I2. Drain currents through the P-channel MOS transistors MP11 and MP12 flow through the N-channel MOS transistors MN11 and MN12, when the N-channel MOS transistors MN11 and MN12 are in the ON state. On the other hand, when the N-channel MOS transistors MN11 and MN12 are in the OFF state, the drain currents flowing through the P-channel MOS transistors MP11 and MP12 flow through the capacitive elements C1 and C2 to charge the capacitive elements C1 and C2.

Since the capacitive element C1 and the gate of the N-channel MOS transistor MN21, and the capacitive element C2 and the gate of the N-channel MOS transistor MN22, are connected to the nodes Nc1 and Nc2, respectively, drain currents flowing through the N-channel MOS transistors MN21 and MN22 are controlled in accordance with voltages at which the capacitive elements C1 and C2 are charged and discharged. The constant current source I3 is connected between the ground and common sources of the N-channel MOS transistors MN21 and MN22 of a differential transistor pair. Drains of the N-channel MOS transistors MN21 and MN22 are connected to nodes N4 and N3 respectively. That is, the N-channel MOS transistors MN21 and MN22 are connected in parallel with the differential transistor pair (MN1 and MN2) of the CML differential buffer section 11, where drain currents are added.

When the N-channel MOS transistors MN11 and MN12 are in the OFF state, the capacitive elements C1 and C2 are charged with the drain currents of the P-channel MOS transistors MP11 and MP12 to increase the voltages at the nodes Nc1 and Nc2. When the N-channel MOS transistors MN11 and MN12 are turned ON, discharge current flows out from the capacitive elements C1 and C2 through the N-channel MOS transistors MN11 and MN12 in the ON state, to lower the voltages at the nodes Nc1 and Nc2. Charge currents are supplied by the current mirror circuit which includes the P-channel MOS transistors MP11 to MP13, while being kept constant. On the other hand, discharge currents are supplied by the current mirror circuit which includes the N-channel MOS transistors MN17 to MN19, while being kept constant. The drain current flowing through the N-channel MOS transistor MN19 is the same as the current supplied by the constant current source I2. At the same time, discharge currents of the capacitive elements C1 and C2 are equal to the drain currents of the P-channel MOS transistors MP11 and MP12, respectively, being the half of the current supplied by the constant current source I2. Therefore, the voltages at the nodes Nc1 and Nc2 are increased and decreased in correspondence to charge and discharge time.

Description is given on operation of the level conversion circuit 10 with reference to FIGS. 7A to 7D. Signals are applied to the input nodes N3 and N4 of the level converting section 12. As shown in FIG. 7A, offsets occur to the plus side and minus side in case of the nodes N3 and N4 due to relative variations of element characteristics and so on, respectively. If being processed only by the level converting section 12, the above signals become signals with deteriorated a duty as mentioned above. The duty ratio is $(50\pm\beta)\%$, as shown in FIG. 7B. More specifically, a signal of the CMOS logic level appears at the node N5 in such a manner that the duty is $(50+\beta)\%$ in a high level period and the duty is $(50-\beta)\%$ in a low level period. On the other hand, a signal of the CMOS logic level appears at the node N6 in such a manner that the duty is $(50-\beta)\%$ in the high level period and the duty is $(50+\beta)\%$ in the low level period.

In the duty correcting section 13, the N-channel MOS transistors MN11 and MN12 are in the ON state when the nodes N5 and N6 take the high level, and the OFF state when the nodes N5 and N6 take the low level, respectively. Therefore, the N-channel MOS transistor MN11 takes the ON state during the duty period of the $(50+\beta)\%$ in one cycle and the OFF state during the duty period of $(50-\beta)\%$, as shown in FIG. 8A. In other words, the capacitive elements C1 is discharged during a period Tdsc when the N-channel MOS transistor MN11 takes the ON state, and charged during a period Tchg when the N-channel MOS transistor MN11 takes the OFF state. Since the discharge period Tdsc is longer than the charge period Tchg, the voltage at the node Nc1 is gradually decreased as the capacitive element C1 is repeatedly charged and discharged, as shown in FIG. 8B.

On the other hand, the N-channel MOS transistor MN12 takes the ON state during the duty period of $(50-\beta)\%$ in one cycle and the OFF state during the duty period of $(50+\beta)\%$, as shown in FIG. 8E. That is, the capacitive element C2 is discharged during a period Tdsc when the N-channel MOS transistor MN12 takes the ON state, and charged during a period Tchg when the N-channel MOS transistor MN12 takes the OFF state. Since the discharge period Tdsc is shorter than the charge period Tchg, the voltage at the node Nc2 is gradually increased as the capacitive element C2 is repeatedly charged and discharged, as shown in FIG. 8F.

With the decrease and increase in the voltages at the nodes Nc1 and Nc2, drain currents through the N-channel MOS transistors MN21 and MN22 are decreased and increased. Since the drains of the N-channel MOS transistors MN21 and MN22 are connected to the nodes N4 and N3, respectively, the drain currents flow through the resistors R1 and R2 of the CML differential buffer section 11. When the current flowing through the node N3 is increased, the voltage at the node N3 is decreased. On the other hand, when current flowing through the node N4 is decreased, the voltage at the node N4 is increased. However, the voltage at the node N4 is lower than the original voltage at the node N4, since the N-channel MOS transistor MN21 is provided and the drain current flows. In other words, as shown in FIG. 7C, a decrease in the voltage at the node N3 for an original input signal N3' is larger than a decrease in the voltage at the node N4 for an original input signal N4'.

As stated above, as the gate voltages at the N-channel MOS transistors MN21 and MN22 are controlled, the high level period of the node N3 becomes shorter and the high level period of the node N4 becomes longer. When the duty ratio is 50%, the charge period Tchg and the discharge period Tdsc are equal as shown in FIG. 8C. In other words, the voltages at the nodes Nc1 and Nc2 are balanced in a certain range, as shown in FIG. 8D. The range of the voltage change can be set based on the capacitance values of the capacitive elements C1 and C2 and charge and discharge current values (current value of the constant current source I2 in this example). Therefore, output signals at the nodes N5 and N6 are signals of the CMOS logic level with the duty ratio 50%, as shown in FIG. 7D.

As mentioned above, it is possible to automatically correct the duty ratio of differential output signals of the CMOS logic level to 50% without an increase in delay time of level conversion, when the duty of clock signals of the CML level as small-amplitude differential input signals of the nodes N1 and N2 are degraded and when the duty is degraded in the CML differential buffer section and the level converting section.

In the embodiments, circuits shown in FIGS. 4, 5, and 6 are exemplified as the CML differential buffer section 11, the level converting section 12, and the duty correcting section 13 respectively. However, the CML differential buffer section 11, the level converting section 12, and the duty correcting section 13 are not limited to the above circuits.

According to the present invention, it is possible to provide a level conversion circuit capable of correcting a duty ratio to 50% even when the cause of duty degradation affects the common mode and normal mode.

Also, according to the present invention, it is also possible to provide a level conversion circuit for performing duty correction without an increase in delay time in the level conversion circuit.

What is claimed is:

1. A level conversion circuit comprising:
an input section, comprising:
N-channel MOS transistors for a differential transistor pair;
a pair of resistors; and
a constant current source,
wherein the constant current source is connected to common sources of the N-Channel MOS transistors, and each of the pair of resistors is connected to drains of the N-Channel MOS transistors as loads, and
wherein said input section is configured to receive a first signal of a first signal level and a correction signal, and to generate a second signal of a second signal level from said first signal and said correction signal;
a level converting section configured to convert said second signal into an output signal of a third signal level; and
a duty correcting section configured to generate said correction signal corresponding to a duty ratio of said output signal and to output said correction signal to said input section, said duty correcting section comprising a correcting section differential transistor pair connected in parallel with said differential transistor pair of the input section,
wherein said second signal is generated through current addition of a drain current of said differential transistor pair in the input section and a drain current of the differential transistor pair in said duty correction section.

2. The level conversion circuit according to claim 1, wherein said duty correcting section comprises:
an integrating circuit configured to measure said duty ratio of said output signal.

3. The level conversion circuit according to claim 1, wherein said duty correcting section comprises:
a constant current source;
a current mirror circuit section configured to supply a current corresponding to a current supplied from said constant current source; and
a capacitive element connected to said current mirror circuit section and configured to carry out charging and discharging operations by using the corresponding current based on said output signal,
wherein said duty ratio is measured based on a voltage across said capacitive element.

4. The level conversion circuit according to claim 3, wherein said duty correcting section generates said correction signal such that a time of the charging operation of said capacitive element is equal to that of the discharging operation of said capacitive element.

5. The level conversion circuit according to claim 1, wherein said first signal of said first signal level comprises a clock signal of a CML (Current Mode Logic) level as a small amplitude differential signal, and
wherein said output signal of said third signal level comprises a differential clock signal of a CMOS (Complementary Metal Oxide Semiconductor) logical level.

6. The level conversion circuit according to claim 5, wherein said level converting section comprises:
a cross-point correcting circuit configured to correct a cross-point of said output signal to a threshold of the CMOS logical level.

7. The level conversion circuit according to claim 6, wherein said cross-point correcting circuit comprises a pair of CMOS inverters connected in parallel in opposing directions,
wherein said level converting section includes two output terminals, and
wherein the parallel connection of said CMOS inverters is connected between the two output terminals.

8. The level conversion circuit according to claim 5, wherein said duty correcting section comprises:
a constant current source;
a current mirror circuit section configured to supply a current corresponding to a current supplied from said constant current source; and
a capacitive element connected to said current mirror circuit section and configured to carry out charging and discharging operations by using the corresponding current based on said output signal,
wherein said duty ratio is measured based on a voltage across said capacitive element.

9. The level conversion circuit according to claim 8, wherein said duty correcting section generates said correction signal such that a time of the charging operation of said capacitive element is equal to that of the discharging operation of said capacitive element.

10. The level conversion circuit according to claim 1, wherein the resistors having the same resistance are connected at first end to drains of the transistors as loads,
wherein other ends of the resistors are connected to a power supply,
wherein a first connection node is placed between a first resistor and a first N-channel transistor,
wherein a second connection node is placed between a second resistor and a second N-channel transistor, and
wherein the first connection node and the second connection node serve as output nodes of a CML (Current Mode Logic) differential buffer section.

11. A method of converting a signal level of a signal, comprising:
inputting a first signal having a first signal level to an input section, said input section comprising:
N-channel MOS transistors for a differential transistor pair;
a pair of resistors, each of the pair of resistors is connected to drains of the N-Channel MOS transistors as a load; and a constant current source connected to common sources of the N-Channel MOS transistors;

amplifying said first signal having said first signal level;

calculating an addition of the amplification result and a correction amount to generate a second signal having a second signal level in a duty correcting section that comprises a correcting section differential transistor pair connected in parallel with said differential transistor pair of the input section, wherein said second signal is generated through current addition of a drain current of said differential transistor pair in the input section and a drain current of the differential transistor pair in said duty correction section;

converting said second signal into an output signal having a third signal level; and feeding back said correction amount corresponding to a duty ratio of said output signal.

12. The method according to claim 11, wherein said feeding back comprises:

supplying a constant current;

supplying a current corresponding to said constant current;

carrying out charging and discharging operations of a capacitive element by using the corresponding current based on said output signal; and determining said duty ratio based on a voltage across said capacitive element.

13. The method according to claim 12, wherein said feeding back comprises:

determining said correction amount such that a time of the charging operation of said capacitive element is equal to that of the discharging operation of said capacitive element.

14. The method according to claim 11, wherein said first signal of said first signal level comprises a clock signal of a CML (Current Mode Logic) level as a small amplitude differential signal, and wherein said output signal of said third signal level comprises a differential clock signal of a CMOS logical level.

15. The method according to claim 14, wherein said converting comprises:

correcting a cross-point of said output signal to a threshold of the CMOS logical level.

16. The method according to claim 15, wherein said correcting is achieved by a pair of CMOS inverters connected in parallel in opposing directions.

17. The method according to claim 14, wherein said feeding back comprises:

supplying a constant current;

supplying a current corresponding to said constant current;

carrying out charging and discharging operations of a capacitive element by using the corresponding current based on said output signal; and determining said duty ratio based on a voltage across said capacitive element.

18. The method according to claim 17, wherein said feeding back comprises:

determining said correction amount such that a time of the charging operation of said capacitive element is equal to that of the discharging operation of said capacitive element.

19. The level conversion circuit according to claim 11, wherein the resistors having the same resistance are connected at first end to said drains of the N-channel MOS transistors as loads, wherein other ends of the resistors are connected to a power supply, wherein a first connection node is placed between a first resistor and a first N-channel MOS transistor, wherein a second connection node is placed between a second resistor and a second N-channel MOS transistor, and wherein the first connection node and the second connection node serve as output nodes of a CML (Current Mode Logic) differential buffer section.

* * * * *